United States Patent [19]

Gregor

[11] Patent Number: 4,581,098

[45] Date of Patent: Apr. 8, 1986

[54] MLC GREEN SHEET PROCESS

[75] Inventor: Lawrence V. Gregor, Hopewell Junction, N.Y.

[73] Assignee: International Business Machines Corporation, Armonk, N.Y.

[21] Appl. No.: 662,488

[22] Filed: Oct. 19, 1984

[51] Int. Cl.[4] .......................... B44C 1/22; B05D 5/12
[52] U.S. Cl. .................................... 156/635; 156/662; 156/663; 156/901; 427/96; 427/307; 430/354
[58] Field of Search ................ 430/494, 25, 413, 418, 430/353, 354, 198; 264/25, 60, 61, 132; 427/43.1, 307, 96; 428/901, 156; 156/901, 635

[56] References Cited

U.S. PATENT DOCUMENTS

| | | | |
|---|---|---|---|
| 1,996,549 | 4/1935 | McNutt | 65/60.3 |
| 3,260,584 | 7/1966 | Badger | 65/60.6 |
| 3,481,760 | 12/1969 | Clark et al. | 427/56.1 X |
| 3,770,529 | 11/1973 | Anderson | 156/3 |
| 3,948,706 | 4/1976 | Schmeckenbecher | 156/89 |
| 3,956,052 | 5/1976 | Koste et al. | 156/247 |
| 4,109,377 | 8/1978 | Blazick et al. | 29/626 |
| 4,356,135 | 10/1982 | Francois et al. | 264/61 |

Primary Examiner—John D. Welsh
Attorney, Agent, or Firm—T. Rao Coca

[57] ABSTRACT

Disclosed is a method of forming a trench pattern in a ceramic green sheet for subsequently filling with a conductive paste resulting in a fully inlaid conductor pattern therefrom. Starting with a green sheet, a high contrast ink drawing of the desired conductor pattern is formed thereon. The drawing may be formed by direct printing on the green sheet or by first printing it on a flexible substrate such as paper and then transferring by xerography to the green sheet. Next, the green sheet is illuminated with an intense noncoherent light source to cause a high degree of absorption of the light energy by the inked areas and volatilization of the green sheet binder material thereunder, thereby forming a trench pattern conforming to the drawn pattern.

20 Claims, 1 Drawing Figure

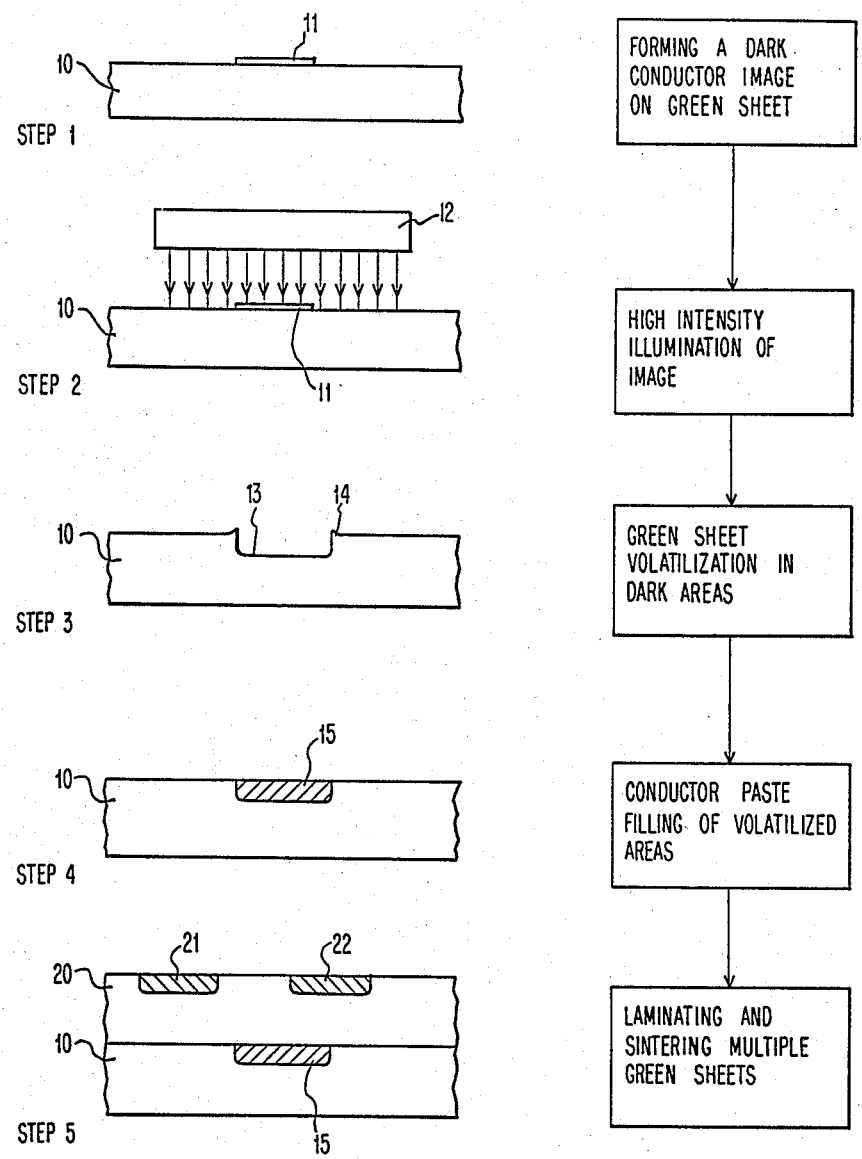

MLC GREEN SHEET PROCESS

BACKGROUND OF THE INVENTION

This invention relates to a process of forming an electrical interconnection pattern on a substrate and, more particularly, to a process of forming a trench or recessed pattern in an unfired ceramic substrate, which upon filling with a conductive paste and sintering will result in a ceramic package having an inlaid electrical interconnection pattern thereon.

The advantages of multilayer ceramic (MLC) substrate package are well known. The MLC typically composed of 17 to 32 layers of molybdenum-metallized alumina with a total thickness of 4 to 5 mm can typically accommodate more than one hundred semiconductor integrated circuit chips. The MLC substrate contains signal planes for inter- and intrachip connections and for routing conductors to input/output (I/O) for external connections. Layers are provided for achieving the proper electrical performance characteristics. MLC improves the circuit density, reliability and performance over those of prior art packages and compliments the advances made in very large scale and ultra large scale integrated semiconductor technology.

The basic process of manufacturing the MLC substrates consists of (1) slurry preparation by combining such raw materials as aluminum oxide, glass powders, an organic binder and a plasticizer; (2) casting the slurry into a uniform thickness (typically 0.2 mm thickness) unfired or "green" ceramic sheet tape followed by cutting the cast tape into square blanks; (3) personalization consisting of, first, punching interlevel via holes in the four corners of the sheets for precise registration of the sheets later on and, second, metallization of the sheets using a conductor paste consisting typically of molybdenum powder uniformly dispersed in a resin and solvent mixture in accordance with a desired interconnection pattern; (4) stacking and lamination which involves first stacking a desired combination of personalized green sheets by using the four-corner location holes to ensure accurate layer-to-layer alignment and then laminating to fuse the layers into a monolithic unit by the application of heat (at about 75° C.) and pressure (up to about 25 MPa); and (5) sintering the laminated substrate on support plates in a kiln in a reducing atmosphere at a high temperature in the range of 1250° C. to 1500° C. to volatilize the organic materials and form a densified and damage-resistant MLC substrate having a firmly bonded metallurgical interconnection pattern.

The most widely used ceramic green sheet metallization process consists of screening a conductive paste on the ceramic green sheet. In this process which is disclosed in U.S. Pat. No. 4,109,377, issued to L. A. Blazick and L. F. Miller and assigned to IBM Corporation, the assignee of the present invention, a metal mask having a desired pattern of openings (i.e. a stencil) is held in close proximity or in direct contact with the green sheet and the conductive paste is extruded through the open spaces of the mask by conventional doctor blading techniques to form a conductor pattern protruding from the surface of the green sheet. A fundamental disadvantage of this process is that when the ceramic sheets are stacked together, due to the protruding nature of the conductor patterns on each sheet, a surface bulge is formed in the MLC substrate. Lamination to flatten out the bulge will cause spreading and distortion of the patterns leading to limitations on line width and cross section, spacing between lines, number of sheets that can be laminated etc. Limitations on line width and cross section translate into limitations on line resistivity since resistivity increases as the cross sectional area of the line decreases. This, in turn, means that the speed of signal propagation is decreased. A second disadvantage of the screening technique is that since the conductor patterns are formed by using a self-supporting stencil there is a limit on how narrow and close the openings therein can be formed without destroying the rigidity of the stencil which is necessary to extrude the conductor paste therethrough. Attendant to this is the problem of cleaning the stencil after each use since the finer the openings the more difficult it is to clean. These limitations amount to dimensions of the order of 25 $\mu$m and a resistivity of the order of 0.5 ohm-cm.

To overcome the limitations with the above conductor screen-on process a second approach has been used in which groove or trench patterns are first formed on the surface portion of the green sheet which are then filled with the conductor paste. In this manner the conductor patterns are fully recessed or inlaid in the green sheet thereby eliminating the surface protuberance.

One way to form the groove or trench patterns is by means of a technique which is a variation of the intaglio printing in which the desired pattern that is to be inlaid in the green sheet is first formed as a positive embossment pattern on a surface (i.e. the pattern is formed on a master tool as a protrusion) and then the positive image is branded or pushed into the green sheet material leaving behind a recessed pattern. However, since the green sheet is not sufficiently soft and flexible to yield to the embossing technique and, in fact, contains a high loading of solid material which is put in to control the shrinkage of the green sheet during the sintering stage it is not practical to mechanically push a pattern into the green sheet.

Another way of forming a recessed pattern in the green sheet which is disclosed in U.S. Pat. No. 3,770,529 issued to L.S. Anderson and assigned to the present assignee is to expose the green sheet through a reflective mask having a predetermined pattern of apertures therein arranged in close proximity with the green sheet to laser radiation, thereby thermally machining the green sheet material. This approach although achieves much finer line definition and allows closer spacing of adjacent lines, necessitates a high powered laser system which is not only rather expensive, but also requires careful control.

By far the most impressive method of forming a groove or trench pattern in the green sheet is by the non-contact electron beam (e-beam) technique disclosed in U.S. Pat. No. 3,956,052 issued to W. W. Koste and E. N. Urfer and assigned to the present assignee. In this method the green sheet is laminated with a thin organic mask material and a high energy e-beam is employed to define a predetermined pattern of openings extending through the organic material and selectively into the green sheet. The e-beam technique while providing a well-defined recessed pattern in the green sheet, which can be subsequently filled with a conductor paste obtaining a highly reliable MLC package, suffers from the requirement that a e-beam pattern generator be used. Such a generator requires high vacuum tooling, sophisticated e-beam optics and custom software to control, all of which render this technique prohibitively expensive.

The present invention obviates the disadvantages of the prior art while preserving their advantages.

It is a principal object of this invention to provide a simple method of forming an inlay pattern of conductive paste on a green sheet.

Another object of the invention is to form a recessed conductive paste interconnection pattern on a ceramic green sheet such that upon stacking, laminating and sintering a plurality of such sheets the resulting package is free of surface bulge.

A further object of the invention is to provide a fully recessed conductive interconnection pattern on a ceramic green sheet of improved line definition and quality which is particularly suitable for fabricating high interconnection density multilayer ceramic packages.

Yet another object of the invention is to provide a method of forming inlaid patterns of conductive paste on a ceramic green sheet which eliminates the need for a rigid, self-supporting mask.

SUMMARY OF THE INVENTION

The above objects and other related objects and advantages may be achieved through the use of a novel method herein disclosed. In one preferred embodiment of the invention, a positive black and white image of the desired conductor pattern is first formed on a paper substrate. Then, the image is transferred to the green sheet by xerography. The resulting black and white copy of the pattern, where the black areas correspond to the conductive portions of the pattern, is illuminated with intense visible and/or ultraviolet light enabling the black areas thereon to absorb the radiation and volatilize the green sheet in the black areas thereby forming a trench pattern therein. A conductive paste is applied in the trenches by conventional techniques, such as doctor blading, forming a conductive paste pattern which is fully recessed in the green sheet.

In an alternative embodiment of the invention, a black and white (or generally, a high contrast) image of the conductor pattern is formed on the green sheet by direct printing rather than by xerography. In one example of the direct printing approach, a high resolution non-rigid stencil having the desired pattern is mated with the green sheet and the stencil pattern is transferred to the green sheet by applying a highly radiation absorptive ink such as carbon ink.

BRIEF DESCRIPTION OF THE DRAWINGS

The novel features and process steps characteristic of the invention are set forth in the appended claims. The invention itself, however, will be best understood by reference to the detailed description which follows in conjunction with the accompanying drawings, wherein:

The sole FIGURE illustrates in Steps 1 through 5 the basic process steps of the present invention.

DETAILED DESCRIPTION OF THE PREFERRED EMBODIMENTS

Now referring to the process steps illustrated in the sole FIGURE, the process is initiated starting with a blank ceramic green sheet member 10. Typically, the green sheet member 10 is approximately 200 $\mu$m thick, mechanically strong and yet sufficiently pliant. The basic constituents of the green sheet are typically aluminum oxide and glass powder in combination with an organic binder and plasticizer. These basic constituents of the member 10, in addition to providing sufficient flexibility and stability, render the green sheet thermally conductive (typically, the thermal conductivity is about 0.02 W cm/°C.) and optically reflective to a certain degree both of which characteristics are advantageously made use of by the present invention.

At Step 1 of the process, a high contrast image of the ultimately desired conductor pattern is formed on the surface of the green sheet member 10. This step may be accomplished in a number of ways. One way is to form a black (or dark) and white (or light) drawing of the ultimately desired conductor pattern on a flexible master substrate, such as, paper. The black/dark areas of the drawing correspond to the conductive portions of the pattern and the light/white areas correspond to the remainder of the green sheet where no conductor pattern is formed. Thereafter, the black and white pattern on the master is transferred to the green sheet member 10 by xerographic means leaving a positive pattern 11 on the member 10 as shown at Step 1. The xerographic transfer of the pattern may be conveniently accomplished by a commercially available xerographic machine such as the IBM Series III Model 40 copier. Carbon-based toner is utilized in this xerographic process to obtain a high contrast dark carbon pattern on the light-colored green sheet member. Carbon is preferred since graphic or pyrolytic carbon is easily available commercially in fine grain enabling a high level loading thereof in the dark areas and since it has a high ultraviolet and visible light absorptivity and thermal conductivity, each of the latter properties being a necessary criterion for operability of the invention as will be explained subsequently hereinbelow. Xerographic transfer of the master pattern to the green sheet member is preferred particularly in a high volume manufacturing environment since the master can be used over and over again to reproduce the pattern on a large number of green sheet members. Another advantage of the xerographic technique is it permits transfer of a high resolution image pattern involving line widths of as small as 10 $\mu$m and inter-line separations as small as 12.5 $\mu$m.

An alternative method of accomplishing Step 1 is by forming a stencil having a pattern of openings, wherein the openings correspond to the desired conductor pattern, by placing the stencil in close proximity or in direct contact with the green sheet member 10, and applying a carbon-based ink to the open areas thereof.

A third method of accomplishing Step 1, which is particularly advantageous when extremely high resolution conductor patterns are desired, is by forming an optical mask bearing the image of the conductor pattern by using an e-beam. Then, by conventional photolithographic process the optical pattern is transferred to a master plate having a thin photosensitive film such as photoresist. Upon developing, a photoresist pattern exactly corresponding to the conductor pattern is formed. The photoresist pattern is finally conveyed to the green sheet by direct contact printing using a suitable ink.

Another approach to Step 1, which is suitable for forming relatively low resolution (for example, 75–100 $\mu$m) conductor lines, is by conventional printing wherein a master lithographic plate bearing the conductor pattern image is formed. Subsequently, by applying a high contrast ink to the plate, the pattern is transferred to the green sheet member.

Regardless of which of the above approaches is used to accomplish Step 1, the green sheet member 10 will be provided with a positive high contrast ink pattern 11 on the surface thereof.

After the high contrast ink pattern is formed, at Step 2 the green sheet member 10 is subjected to a source of high intensity light 12 to uniformly illuminate the entire green sheet so that the inked areas 11 of the sheet, due to their inherent high light absorption capability, readily absorb the light energy and the remainder areas of the green sheet absorb little or an insignificant fraction of the light energy. The wavelength and intensity of the light used in this step is governed by the absorption characteristics, the thickness of the ink pattern 11 and the duration of the light exposure. The wavelength of the light used in this illumination step, in general, should match as closely as possible with the absorption spectrum of the ink material. In the case of carbon-based ink, for example, wavelengths corresponding to the visible and/or ultraviolet portions of the electromagnetic spectrum would be suitable. Regarding the intensity of the light, generally the thicker the ink pattern the higher the light intensity required. However, the duration of exposure of the green sheet member 10 to the light is a countervailing consideration since a long duration will tend to warm up the entire green sheet member which would work against the localized transfer of light energy via only the inked regions thereof and localized high temperature rise in those regions which are intended to be accomplished in Step 2. In other words, the intensity of the light source and duration of its activation are dictated by considerations attendant to the optical and thickness characteristics of the green sheet and the ink thereon such that the inked areas heat up at a significantly faster rate than the non-inked areas. A preferred method of accomplishing this localized, selective heating of the green sheet member 10 is either a single exposure with a high intensity light for a long exposure time or multiple exposures involving a low intensity light and short exposure times.

One example of the light source 12 is the mercury arc radiation source. Mercury arc source is particularly suitable due to its high intrinsic brightness in the ultraviolet wavelength range of 250–436 nm. Another example of the light source 12 is a gas discharge source in which a high capacitance capacitor is charged and subsequently suddenly discharged through a gaseous conductor such as Xenon obtaining a brilliant flash of light for a short duration. The duration of the light pulse should be of the order of a few milliseconds to tenths of seconds. Alternatively, light source 12 may be a continuous high intensity source which is interrupted by means of a high speed open-and-close shutter interposed between the source 12 and the green sheet member 10.

A practical way of selecting the light source 12 to achieve the best results is to obtain independent light absorption curves for the green sheet material and the ink material and identifying the wavelength(s) in terms of absorption which would be best compatible with the ink material and least compatible with the green sheet material. Then, a light source having its intensity peak at the identified wavelength(s) is selected.

The light energy absorbed by the ink pattern 11 in accordance with Step 2 will be instantaneously converted into heat. The heat, in turn, due to the high thermal conductivity of the ink material will be immediately conducted to the green sheet areas directly beneath the pattern 11 causing a sudden and significant temperature rise in those areas. The ink pattern 11 as it absorbs the heat, due to its low heat capacity, will first volatilize followed by volatilization of the green sheet binder material thereunder. As a result of this volatilization, the green sheet material therein will explosively evaporate leaving a trench or recessed pattern 13 at Step 3. The volatilization of the ink and green sheet materials will be clean and the resulting trench pattern will be uniform with near-vertical walls and near-horizontal floors.

In this manner recessed or trench patterns are formed in the green sheet member by thermal machining using a non-coherent, visible light radiation.

After forming the trench pattern, the normal green sheet metallization process is resumed to complete fabrication of a single layer or multilayer ceramic substrate package. As illustrated at Step 4, a conductive metal paste 15 is applied in the recessed channels by such means as extrusion heads, rolling, wiping, doctor blading, etc. Liquid and powder conductive material can also be used to fill the grooves and need not be limited to conductive paste type of material.

In Step 4, due to the high pressure applied to the green sheet member 10 during the metallization process, any superficial raised walls 14 shown in connection with Step 3 will be smashed. The smashed debris will fall into the groove and mix with the conductive paste material and eventually disappear during the sintering stage of the process. In other words, the green sheet member 10, following metallization, will be planar.

At Step 5, the metallized green sheet member 10 is laminated and stacked with one or more similarly metallized green sheet members 20 having fully recessed conductor paste fillings 21 and 22 and then sintered together into an unified body.

Thus, there has been provided a simple and economical method of forming grooves in a ceramic green sheet which upon filling with a conductive paste yields a conductive pattern which is fully inlaid or recessed in the green sheet. Since the paste is fully recessed in the green sheet, spreading and bleeding of conductive paste characteristic of prior art techniques is eliminated. This method permits forming a high density of lines having a high resolution, the limitations of which are merely predicated by the limitations imposed on printing ink patterns on the green sheet. The present method permits minimal disturbance of the overall dimensions of the stacked green sheets since the prior art problem of squeezing mass into a small volume is eliminated by fully recessing the conductive paste.

Although, the invention has been described with reference to shining visible and/or ultraviolet radiation to cause volatilization of the dark areas of the green sheet, purely visible radiation is also suitable.

Although, this process has been described with specific reference to forming channels or trenches in a green sheet member, the process will be readily conducive for forming vias in the green sheet filling which with a conductive paste interlevel via studs connecting the conductor pattern on one layer with that of its adjacent (top or bottom) layer may be formed.

Also, while the invention has been set forth in the context of forming recesses in a ceramic green sheet material, it can be conveniently extended to form recesses and/or vias in an organic material based substrate, for example, a polyimide based substrate.

Also, the above-described specific embodiments of the invention have been set forth for the purposes of illustration. It will be apparent to those skilled in the art that various modifications may be made without departing from the principles of this invention as pointed out and disclosed herein. For this reason, it is not intended that the invention should be limited other than by the scope of the appended claims.

What is claimed is:

1. A method making a trench pattern in a ceramic green sheet, said method comprising:
   (a) forming on a surface of said sheet an ink pattern of a high optical contrast in relation to said sheet; and
   (b) illuminating said sheet with radiation having a wavelength which corresponds to the absorption spectrum of said ink to cause a relatively high absorption of said wavelength by said ink pattern as compared to the remainder of said sheet, thereby heating and volatilizing the areas of said sheet corresponding to said ink pattern and converting said ink pattern into a trench pattern.

2. The method as recited in claim 1 wherein said illuminating step comprises shining a single flash of high intensity radiation for a predetermined duration.

3. The method as recited in claim 1 wherein said illuminating step comprises repetitiously shining a flash of relatively low intensity radiation for a short duration.

4. The method as recited in claim 1 wherein said ink is carbon-based ink.

5. The method as recited in claim 1 wherein said radiation is visible light.

6. The method as recited in claim 1 wherein said radiation is ultraviolet radiation.

7. The method as recited in claim 1 wherein said radiation is a mixture of visible and ultraviolet radiation.

8. The method as recited in claim 1 wherein said step (a) comprises direct printing.

9. The method as recited in claim 1 wherein said step (a) comprises:
   forming a high contrast pattern on a flexible substrate; and
   transferring said pattern on the flexible substrate to said volatilizable substrate by xerography.

10. A method of forming a channel pattern in a ceramic green sheet, said method comprising:
    (a) forming on a flexible substrate surface a pattern having a high optical contrast with said surface;
    (b) transferring said pattern to at least a surface portion of said green sheet by xerography obtaining a high optical contrast dark and light image of said substrate pattern; and
    (c) illuminating the image on said green sheet with an intense radiation having a wavelength which corresponds to the absorption spectrum of the dark portion of said image enabling the dark portion of said image to readily absorb said radiation and volatilize the ceramic sheet corresponding to said dark portion, thereby forming a well-defined channel pattern therein.

11. The method as recited in claim 9 wherein said radiation is visible light.

12. The method as recited in claim 9 wherein said radiation is ultraviolet.

13. The method as recited in claim 10 wherein said radiation is a combination of visible and ultraviolet light.

14. A method of forming a fully inlaid pattern of conductive paste on a sinterable ceramic sheet suitable for fabricating a multilayer ceramic package, said method comprising:
    (a) forming on a flexible substrate a black and white drawing of said pattern, the black areas of said drawing corresponding to the conductive portions of said pattern;
    (b) transferring said drawing to said ceramic sheet by xerography to form a dark and light image thereon, the dark and light areas of said image corresponding, respectively, to the black and white areas of said drawing;
    (c) illuminating the image on the ceramic sheet with an intense radiation having a wavelength which matches the absorption spectrum of said dark areas and volatilizing the ceramic sheet in the dark areas thereof forming trenches in said sheet corresponding to said pattern; and
    (d) filling said trenches with a conductive paste.

15. The method as in claim 14 wherein said flexible substrate is paper.

16. The method as in claim 14 wherein said radiation is visible light.

17. The method as in claim 14 wherein said radiation is visible and ultraviolet light.

18. The method as in claim 14 wherein said illuminating step comprises shining pulsed radiation.

19. A method of making a trench pattern in a polyimide-based substrate, said method comprising:
    (a) forming on a surface portion of said substrate an ink pattern having a high optical contrast with said substrate; and
    (b) illuminating said substrate with radiation having a wavelength which corresponds to the absorption spectrum of said ink to cause a relatively high absorption of said radiation by said ink pattern as compared to the remainder of the substrate, thereby heating and volatilizing the areas of the substrate corresponding to said ink pattern and converting said ink pattern into a trench pattern.

20. The method as recited in claim 19 wherein said ink is carbon-based ink.

* * * * *